US008022402B2

(12) United States Patent
Li et al.

(10) Patent No.: US 8,022,402 B2

(45) Date of Patent: Sep. 20, 2011

(54) ACTIVE DEVICE ARRAY SUBSTRATE

(75) Inventors: Jen-Chieh Li, Kaohsiung County (TW); Shun-Fa Feng, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 206 days.

(21) Appl. No.: 12/343,510

(22) Filed: Dec. 24, 2008

(65) Prior Publication Data

US 2010/0140615 A1 Jun. 10, 2010

(30) Foreign Application Priority Data

Dec. 10, 2008 (TW) ................................ 97148080 A

(51) Int. Cl.
*H01L 23/58* (2006.01)

(52) U.S. Cl. ..................... 257/48; 257/E23.002; 438/18

(58) Field of Classification Search .................... 257/48, 257/E23.002; 438/18

See application file for complete search history.

(56) References Cited

U.S. PATENT DOCUMENTS 6,043,971 A * 3/2000 Song et al. .................... 361/111
6,392,719 B2 5/2002 Kim
6,642,580 B1 11/2003 Yun

* cited by examiner

*Primary Examiner* — Jami M Valentine

(74) *Attorney, Agent, or Firm* — Jianq Chyun IP Office

(57) ABSTRACT

An active device array substrate including a substrate, a pixel array, and peripheral circuit is provided. The substrate has a display region and a peripheral region. The pixel array is disposed on the display region of the substrate, wherein the pixel array includes signal lines and pixels, each of the pixels is electrically connected to the signal lines respectively and extends from the display region to the peripheral region. The peripheral circuit is disposed on the peripheral region and includes a testing circuit electrically connected to the signal lines. Additionally, the testing circuit includes shorting bars and connecting conductors, wherein each of the signal lines is electrically connected to one of the shorting bars through one of the connecting connectors respectively, and at least two of the signal lines connected to the same shorting bar are electrically connected to each other through one of the connecting conductors.

14 Claims, 9 Drawing Sheets

232

232a

ACTIVE DEVICE ARRAY SUBSTRATE

CROSS-REFERENCE TO RELATED APPLICATION

This application claims the priority benefit of Taiwan application serial no. 97148080, filed Dec. 10, 2008. The entirety of the above-mentioned patent application is hereby incorporated by reference herein and made a part of this specification.

BACKGROUND OF THE INVENTION

1. Field of the Invention

The present invention is related to an active device array substrate, and more particularly, related to an active array substrate capable of preventing open circuit of signal lines during testing processes.

2. Description of Related Art

Thin film transistor liquid crystal displays (TFT-LCD) have become a mainstream product in the display market due to high image quality, great space efficiency, low power consumption, and no radiation. During the processes of fabricating liquid crystal display panels, testing processes are performed necessarily so as to ensure the liquid crystal display panels are capable of operating normally. Generally, shorting bars are adapted to test the liquid crystal display panels. Generally, during the testing processes of the liquid crystal display panels, a testing signal is input to all the scan lines simultaneously through a gate shorting bar electrically connected to the scan lines so as to enable all the pixels. Then, red, green and blue testing signals transmitted by a plurality of source shorting bars are respectively input to all the pixels through connecting conductors and data lines. After the testing signals are input to the pixels, the liquid crystal display panels are observed so as to determine whether the liquid crystal display panels display normally.

When the above-mentioned testing processes are performed, line defects are usually detected. However, the line defects are not absolutely resulted from broken data lines or broken scan lines. Under some situations, the line defects result from open circuit of the connecting conductor(s) electrically connected between the data lines and the source shorting bars or electrically connected between the scan line and the gate shorting bar. Specifically, in the first three columns of pixels (or namely the forward three columns of pixels, or namely the preceding three columns of pixels), the above-mentioned line defect phenomenon usually occurs, wherein each one of the first three column of pixel within one data line. Since testing signals having excess current (i.e. red, green, and blue testing signals) are applied during the testing processes of the liquid crystal display panels, the connecting conductors connected between the first three data lines (or namely the forward three data lines, or namely the preceding three data lines) and the source shorting bars are usually broken. In order to prevent the broken phenomenon of the connecting conductors occurs in the first data line within the first pixel (or namely the most outside data line in the most outside pixel, or namely the outset data line in the outset pixel) again and again, a prior art solution is provided. The prior art solution is illustrated in FIG. 1A and FIG. 1B.

FIG. 1A is a top view of a prior art testing circuit. FIG. 1B is an equivalent circuitry of the prior art testing circuit shown in FIG. 1A. Referring to FIG. 1A and FIG. 1B, the layout of the 1$^{st}$ data line DL1, the 2$^{nd}$ data line DL2, and the 3$^{rd}$ data lines DL3 in the prior art testing circuit 100 is modified so as to reduce the broken phenomenon of the connecting conductors 120. Specifically, an end of the 1$^{st}$ data line DL1 branches and is electrically connected to the shorting bar 110 through two connecting conductors 120; an end of the 2$^{nd}$ data line DL2 branches and is electrically connected to the shorting bar 110 through two connecting conductors 120; and an end of the 3$^{rd}$ data lines DL3 branches and is electrically connected to the shorting bar 110 through two connecting conductors 120. However, referring to the equivalent circuitry in FIG. 1B, testing signals having excess current are still applied to the 1$^{st}$ data line DL1, the 2$^{nd}$ data line DL2, and the 3$^{rd}$ data lines DL3 during the testing processes of the liquid crystal display panels. Accordingly, the branch design of the ends of the 1$^{st}$ data line DL1 , the 2$^{nd}$ data line DL2, and the 3$^{rd}$ data lines DL3 is not effective to reduce the probability of the broken phenomenon of the connecting conductors 120. The broken phenomenon of the connecting conductors 120 marked in a circle in FIG. 2A and FIG. 2B is serious. The position A' shown in FIG. 1A is corresponding to the portion marked in a circle shown in FIG. 2A while the position A" shown in FIG. 1B is corresponding to the portion marked in a circle shown in FIG. 2B.

Therefore, how to reduce the probability of the broken phenomenon of the connecting conductors 120 effectively during the testing processes of liquid crystal display panels is an important issue.

SUMMARY OF THE INVENTION

The present is directed to provide an active device array substrate capable of reducing the probability of line defects.

As embodied and broadly described herein, an active device array substrate including a substrate, a pixel array, and peripheral circuit is provided. The substrate has a display region and a peripheral region. The pixel array is disposed on the display region of the substrate, wherein the pixel array includes a plurality of signal lines and a plurality of pixels, each of the pixels is electrically connected to the signal lines respectively and extends from the display region to the peripheral region. The peripheral circuit is disposed on the peripheral region and includes a testing circuit electrically connected to the signal lines. Additionally, the testing circuit includes a plurality of shorting bars and a plurality of connecting conductors, wherein each of the signal lines is electrically connected to one of the shorting bars through one of the connecting connectors respectively, and at least two of the signal lines connected to the same shorting bar are electrically connected to each other through one of the connecting conductors.

In an embodiment of the present invention, the signal lines includes a plurality of scan lines and a plurality of data lines, wherein the scan lines and the data lines extend from the display region to the peripheral region, and the data lines are electrically connected to the testing circuit.

In an embodiment of the present invention, the shorting bars include a first shorting bar and a second shorting bar, and a third shorting bar, wherein the data lines includes a plurality of first data lines electrically connected to the first shorting bar, a plurality of second data lines electrically connected to the second shorting bar, and a plurality of third data lines electrically connected to the third shorting bar.

In an embodiment of the present invention, the first data lines includes a plurality of $(3n-2)^{th}$ data lines, the second data lines includes a plurality of $(3n-1)^{th}$ data lines, and the third data lines includes a plurality of $(3n)^{th}$ data lines, n is any integer.

In an embodiment of the present invention, the connecting conductors includes a plurality of first connecting conductors, a plurality of second connecting conductors, and a plurality of third connecting conductors. The first connecting conductors are electrically connected to the first data lines and the first shorting bar. The second connecting conductors are electrically connected to the second data lines and the second shorting bar. The third connecting conductors are electrically connected to the third data lines and the third shorting bar.

In an embodiment of the present invention, the 1$^{st}$ data line and the 4$^{th}$ data line are electrically connected to each other through one of the first connecting conductors.

In an embodiment of the present invention, the 1$^{st}$ data line, the 4$^{th}$ data line, and the 7$^{th}$ data line are electrically connected to each other through one of the first connecting conductors.

In an embodiment of the present invention, the 2$^{nd}$ data line and the 5$^{th}$ data line are electrically connected to each other through one of the second connecting conductors.

In an embodiment of the present invention, the 2$^{nd}$ data line, the 5$^{th}$ data line, and the 8$^{th}$ data line are electrically connected to each other through one of the second connecting conductors.

In an embodiment of the present invention, the 3$^{rd}$ data line and the 6$^{th}$ data line are electrically connected to each other through one of the third connecting conductors.

In an embodiment of the present invention, the 3$^{rd}$ data line, the 6$^{th}$ data line, and the 9$^{th}$ data line are electrically connected to each other through one of the third connecting conductors.

In an embodiment of the present invention, each of the signal lines is electrically connected to one of the shorting bars through a plurality of first contact holes and one of the connecting conductors respectively.

In an embodiment of the present invention, each of the signal lines is electrically connected to one of the connecting conductors through a plurality of second contact holes respectively.

In an embodiment of the present invention, each of the shorting bars has at least one opening to expose an end of one of the data lines, wherein a portion of the second contact holes are located in the opening of the shorting bars.

Accordingly, in the present invention, at least two signal lines connected to the same shorting bar are electrically connected to each other through one connecting conductor. Since the connecting conductor connected between the at least two signal lines has greater area, the probability of open circuit between the signal lines and the shorting bars is reduced.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
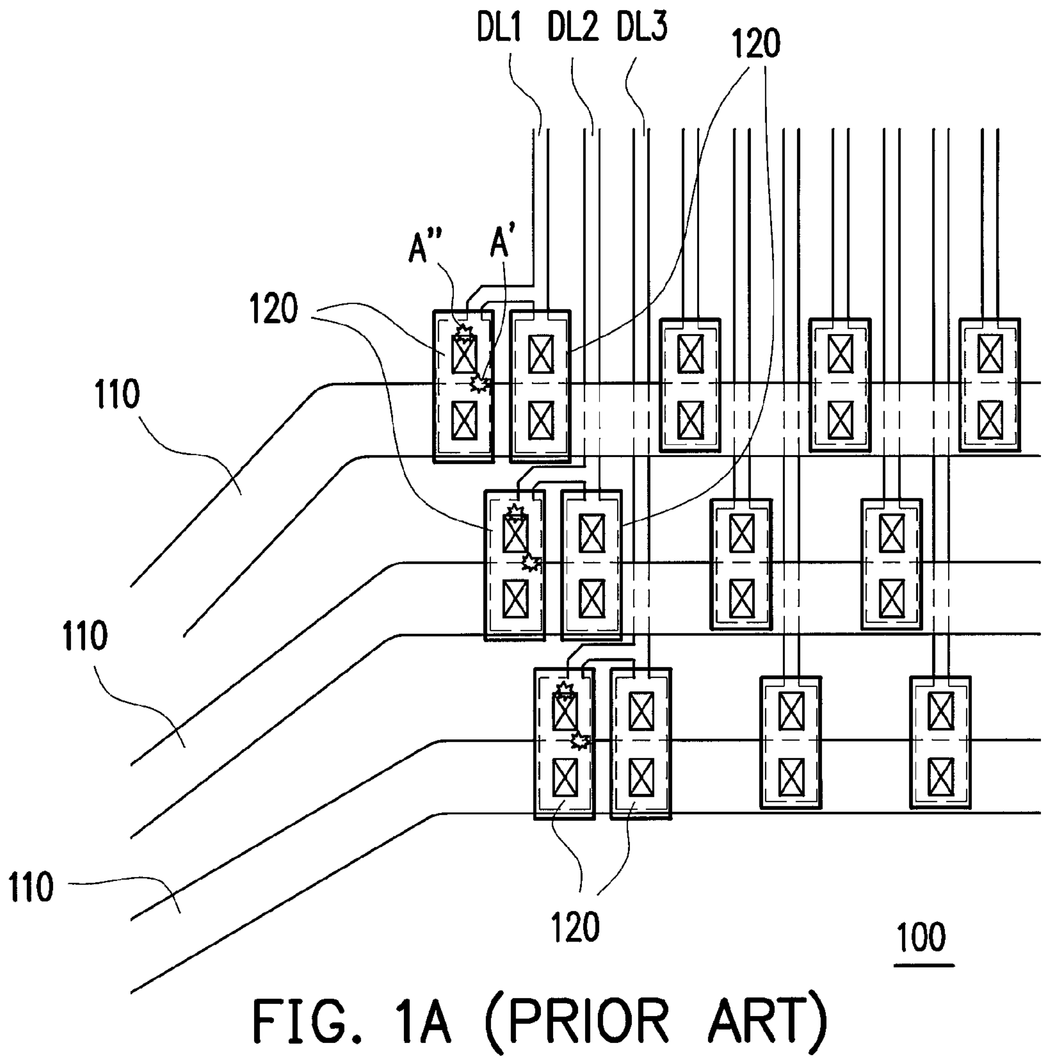
FIG. 1A (PRIOR ART)
FIG. 1A is a top view of a prior art testing circuit.
Figure 1B:
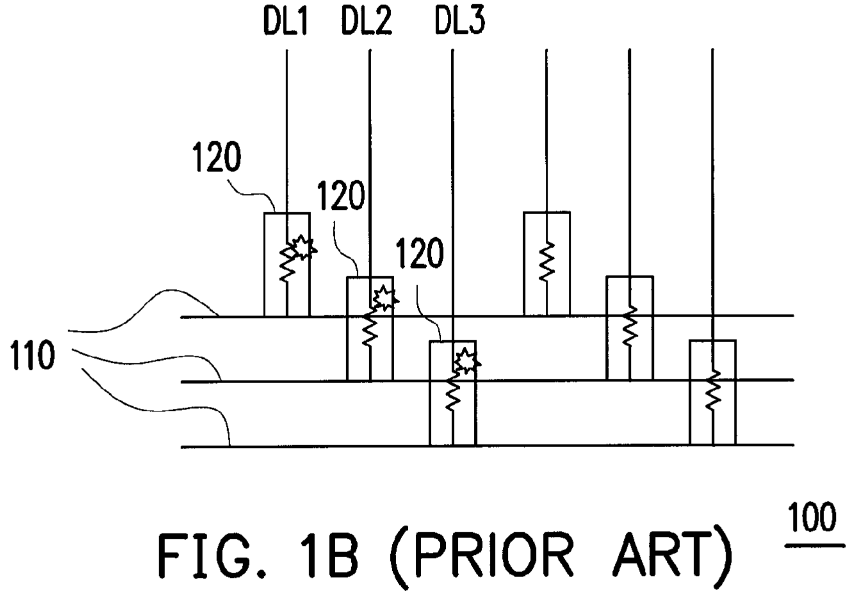
FIG. 1B (PRIOR ART)
FIG. 1B is an equivalent circuitry of the prior art testing circuit shown in FIG. 1A.
Figure 2A:
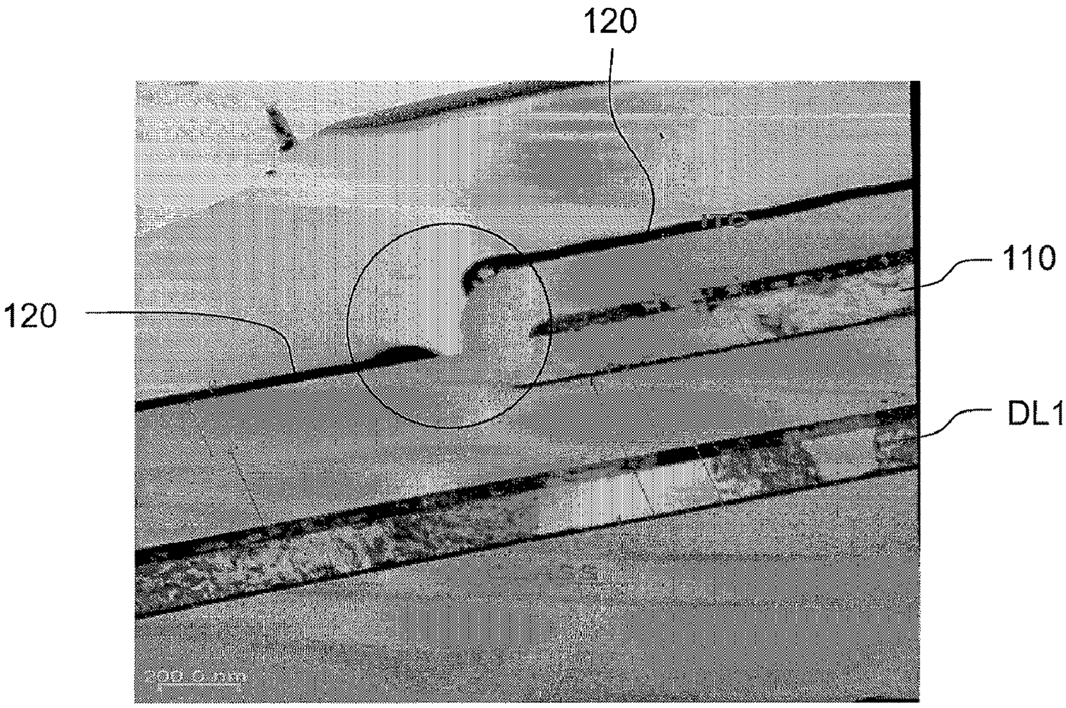
FIG. 2A (PRIOR ART)
FIG. 2A and FIG. 2B are cross-sectional view of Transmission Electron Microscope at position A' and position A".
Figure 2B:
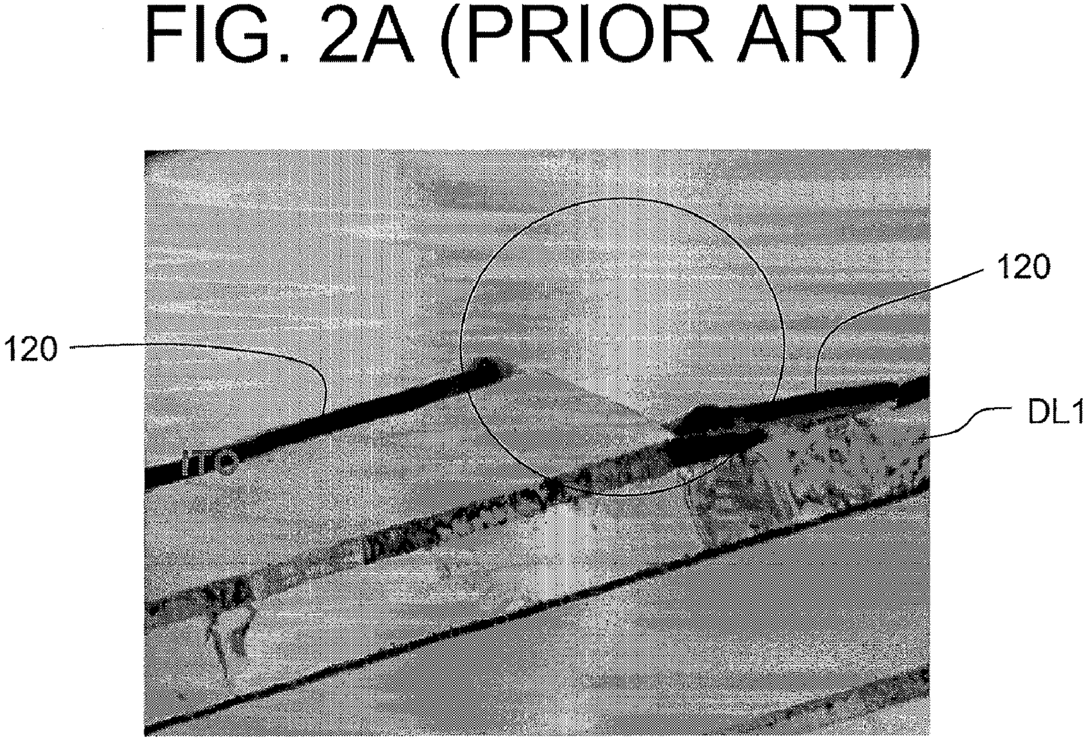
FIG. 2B (PRIOR ART)
Figure 3:
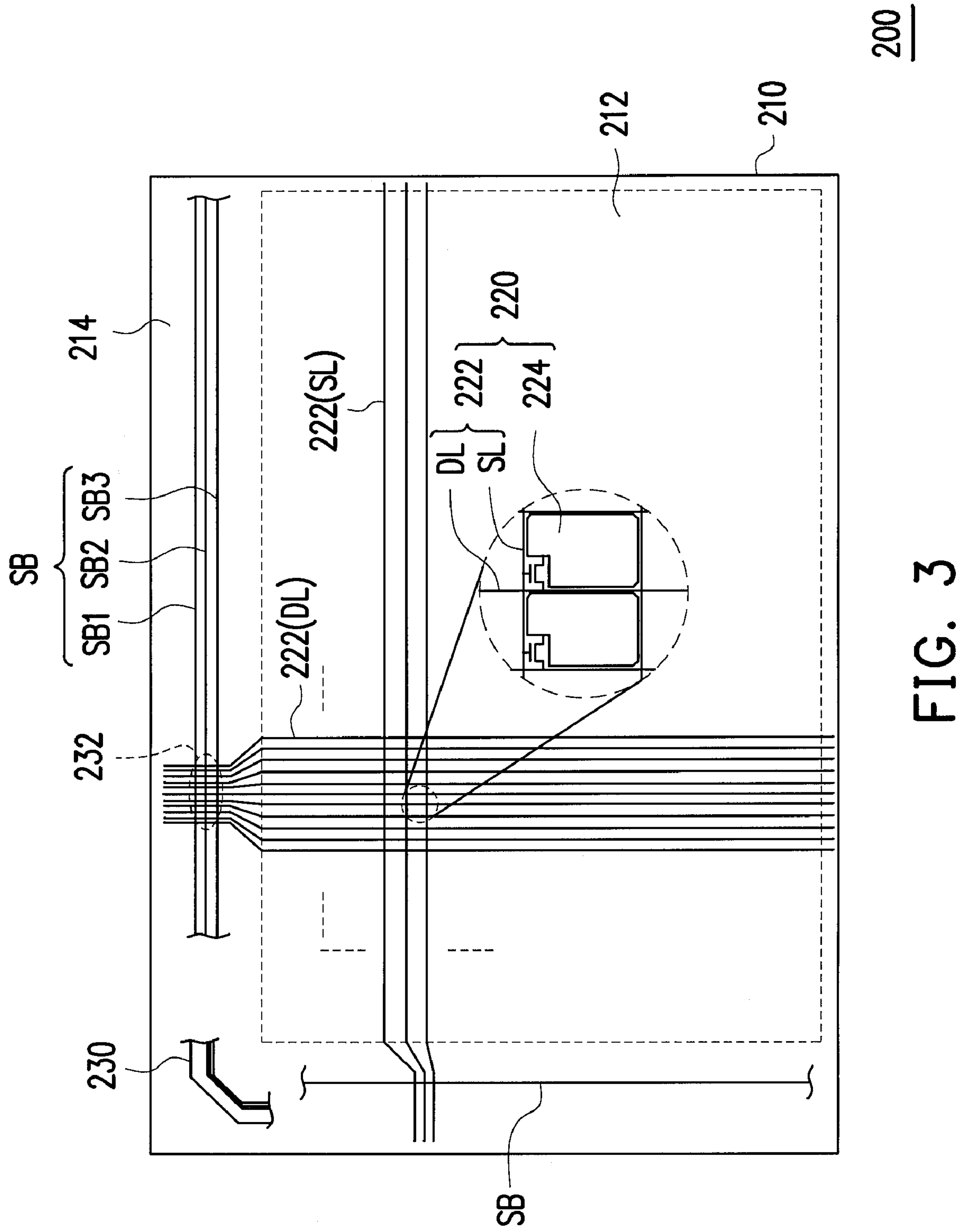
FIG. 3 is a schematic view of an active device array substrate according to an embodiment of the present invention.

FIG. 3 schematically illustrates an active device array substrate in accordance with an embodiment of the present invention. Referring to FIG. 3, the active device array substrate 200 of the embodiment includes a substrate 210, a pixel array 220, and a peripheral circuit 230. The substrate 210 has a display region 212 and a peripheral region 214. The pixel array 220 is disposed on the display region 212 of the substrate 210, wherein the pixel array 220 includes a plurality of signal lines 222 and a plurality of pixels 224, each of the pixels 224 is electrically connected to the signal lines 222 respectively and extends from the display region 212 to the peripheral region 214. The peripheral circuit 230 is disposed on the peripheral region 214 and includes a testing circuit 232 electrically connected to the signal lines 222. In the present embodiment, the peripheral circuit 230 is generally defined as circuit designs on the peripheral region 214. In the present embodiment, the signal lines 222 includes a plurality of scan lines SL and a plurality of data lines DL, wherein the scan lines SL and the data lines DL extend from the display region 212 to the peripheral region 214, and the data lines DL are electrically connected to the testing circuit 232. The transistors illustrated in FIG. 3 may be bottom gate transistors, top gate transistors, or other suitable transistors. Additionally, in transmissive type pixels, pixel electrodes of the pixels 224 may be formed by transparent conductive materials, such as indium tin oxide (ITO), indium zinc oxide (IZO), aluminum tin oxide (ATO), aluminum zinc oxide (AZO), cadmium tin oxide (CTO), or the combination thereof. In reflective type pixels, pixel electrodes of the pixels 224 may be formed by reflective conductive materials, such as Au, Ag, Al, Sn, Ti, Mo, Ta, Cr, or the alloy thereof. In transflective pixels, the transparent conductive materials and the reflective conductive materials are simultaneously utilized to form the pixel electrodes. In the micro-reflective pixels, though the above-described transparent conductive materials are utilized to form the pixel electrodes, small amount of light is reflected by the lines or electrodes of devices (e.g. signal lines, capacitors, transistors etc.) on the active device array substrate 200.

Figure 4A:
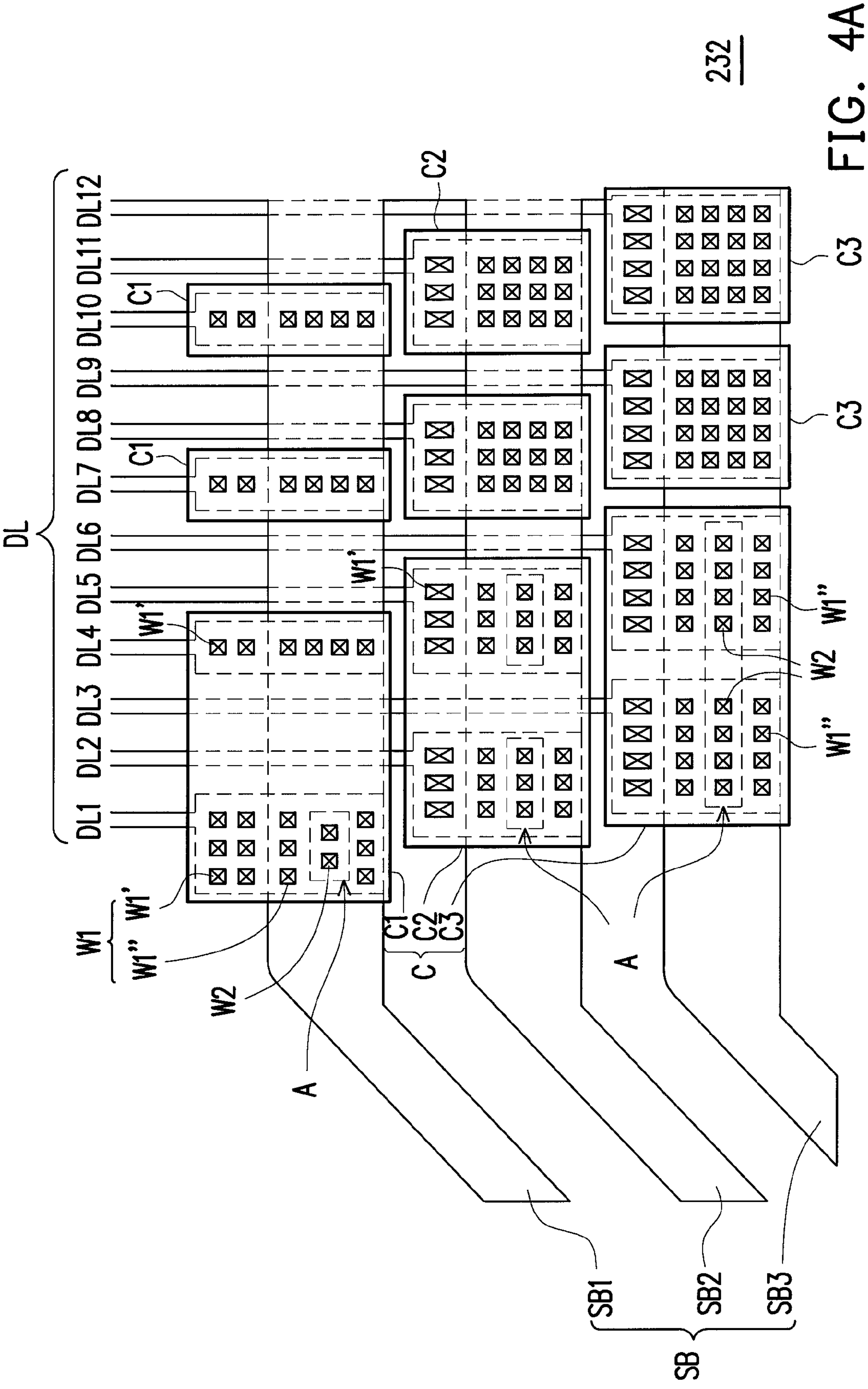
FIG. 4A is a top view of a testing circuit in accordance with the first embodiment of the present invention.

FIG. 4A is a top view of a testing circuit in accordance with the first embodiment of the present invention. Referring to FIG. 3 and FIG. 4A, the testing circuit 232 includes a plurality of shorting bars SB and a plurality of connecting conductors C, wherein each of the signal lines 222 is electrically connected to one of the shorting bars SB through one of the connecting connectors C respectively, and at least two of the signal lines 222 connected to the same shorting bar SB are electrically connected to each other through one of the connecting conductors C. Specifically, the shorting bars SB includes a first shorting bar SB1, a second shorting bar SB2, and a third shirting bar SB3, the data lines DL includes a plurality of first data lines (DL1, DL4, DL7, DL10, . . . , DL3$n$−2) electrically connected to the first shorting bar SB1, a plurality of second data lines (DL2, DL5, DL8, DL11, . . . , DL3n−1) electrically connected to the second shorting bar SB2, and a plurality of third data lines (DL3, DL6, DL9, DL12, . . . , DL3n) electrically connected to the third shorting bar SB3, wherein n is any integer. Additionally, the connecting conductors C includes a plurality of first connecting conductors C1, a plurality of second connecting conductors C2, and a plurality of third connecting conductors C3, wherein the first connecting conductors C1 are electrically connected to the first data lines (DL1, DL4, DL7, DL10, . . . , DL3n−2) and the first shorting bar SB1, the second connecting conductors C2 are electrically connected to the second data lines (DL2, DL5, DL8, DL11, . . . , DL3n−1) and the second shorting bar SB2, and the third connecting conductors C3 are electrically connected to the third data lines (DL3, DL6, DL9, DL12, . . . , DL3n) and the third shorting bar SB3. In other words, the shorting bars (SB1, SB2, SB3) are electrically insulated from each other. Additionally, the first data lines (DL1, DL4, DL7, DL10, . . . , DL3n−2) connected to the first shorting bar SB1, the second data lines (DL2, DL5, DL8, DL11, . . . , DL3n−1) connected to the second shorting bar SB2, and the third data lines (DL3, DL6, DL9, DL12, . . . , DL3n) connected to the third shorting bar SB3 are electrically insulated from each other. That is, the second data lines (DL2, DL5, DL8, DL11, . . . , DL3n−1) extend across the first shorting bar SB1, and the third data lines (DL3, DL6, DL9, DL12, . . . , DL3n) extend across the first shorting bar SB1 and the second shorting bar SB2. Taking the first shorting bar SB1, the first data lines DL1 and the first connecting conductors C1 as an example, the first shorting bar SB1 and the first connecting conductors C1 may be sequentially formed after the first data lines DL1 is formed. In another embodiment, the first data lines DL1 and the first connecting conductors C1 may be sequentially formed after the first shorting bar SB1 is formed. In the other embodiment, the first connecting conductors C1 and the first shorting bar SB1 may be sequentially formed after the first data lines DL1 is formed. In still another embodiment, the first connecting conductors C1 and the first data lines DL1 may be sequentially formed after the first shorting bar SB1 is formed. In yet another embodiment, the first data lines DL1 and the first shorting bar SB1 may be sequentially formed after the first connecting conductors C1 is formed. In an alternate embodiment, the first shorting bar SB1 and the first data lines DL1 may be sequentially formed after the first connecting conductors C1 is formed. In a preferred embodiment, the first data lines DL1 is formed first, and the first shorting bar SB1 and the first connecting conductors C1 is sequentially formed.

Figure 4B:
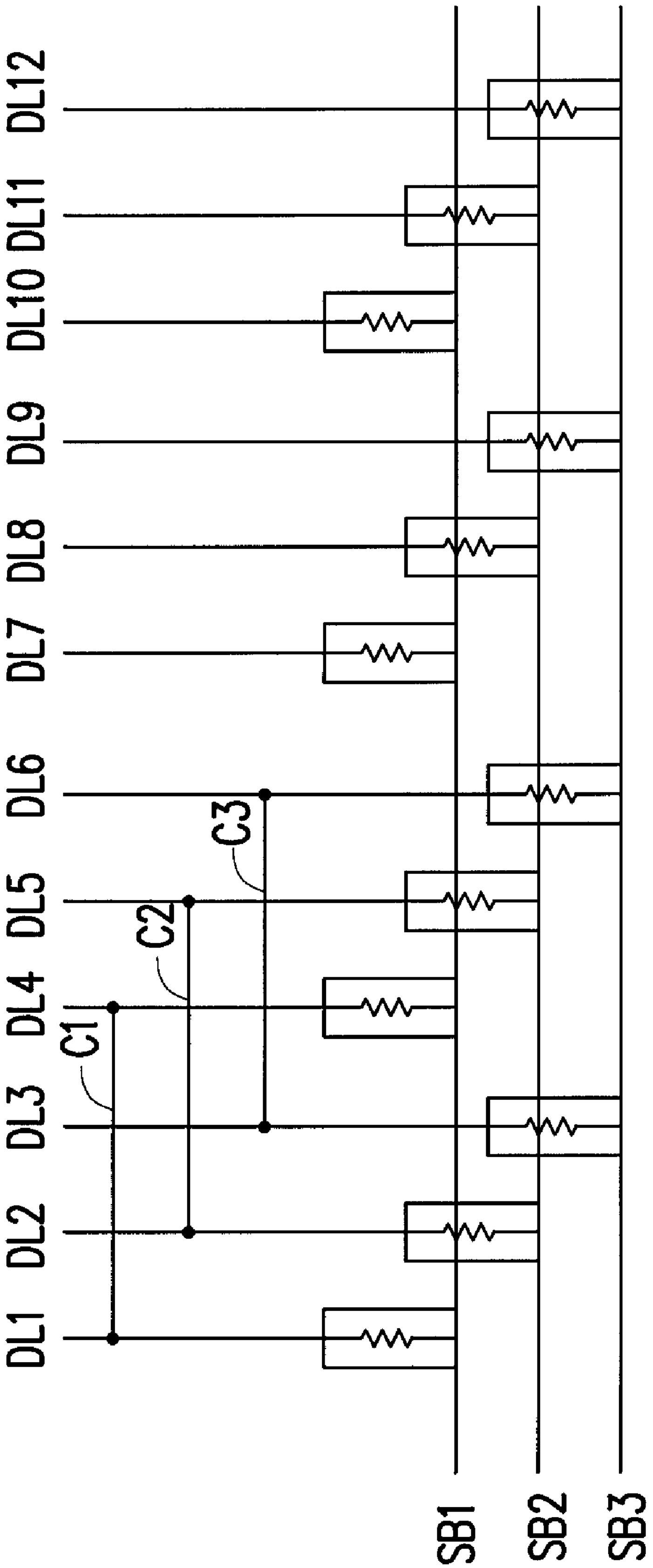
FIG. 4B is an equivalent circuitry of the prior art testing circuit shown in FIG. 4A.

In the present embodiment, the 1$^{st}$ data line and the 4$^{th}$ data line of the first data lines DL1 shown in FIG. 4A are electrically connected to each other through the leftest first connecting conductor C1. The 2$^{nd}$ data line and the 5$^{th}$ data line of the second data lines DL2 shown in FIG. 4A are electrically connected to each other through the leftest second connecting conductor C2. The 3$^{rd}$ data line and the 6$^{th}$ data line of the third data lines DL3 shown in FIG. 4A are electrically connected to each other through the leftest third connecting conductor C3. The equivalent circuitry is shown in FIG. 4B.

For instance, the first shorting bar SB1, the second shorting bar SB2, and the third shorting bar SB3 are utilized to transmit red, green, and blue testing signals to the first data lines (DL1, DL4, DL7, DL10, . . . , DL3n−2), the second data lines (DL2, DL5, DL8, DL11, . . . , DL3n−1) and the third data lines (DL3, DL6, DL9, DL12, . . . , DL3n) respectively. The testing signals transmitted by the first shorting bar SB1, the second shorting bar SB2 and the third shorting bar SB3 may be modified. For example, white, orange, purple, brown, yellow testing signals may also be transmitted by the shorting bars SB. In the present embodiment, since the leftest first connecting conductor (or namely the most outside first connecting conductor, or namely the outset first connecting conductor) C1 has sufficient area to extend across the 1$^{st}$ data line, the 4$^{th}$ data line and the lines located between the 1$^{st}$ data line and the 4$^{th}$ data line (e.g. the 2$^{nd}$ data line, the 3$^{rd}$ data line, and a portion of the first shorting bar SB1), the excess current of the testing signals is spread (or namely disperse) to the 1$^{st}$ data line and the 4$^{th}$ data line. Accordingly, the leftest first connecting conductor C1 is not broken easily during testing processes. Additionally, due to the sufficient area of the leftest first connecting conductor C1, the electrical connection between the first shorting bar SB1, the 1$^{st}$ data line and the 4$^{th}$ data line is more reliable. Similarly, since the leftest second connecting conductor (or namely the most outside second connecting conductor, or namely the outset second connecting conductor) C2 has sufficient area to extend across the 2$^{nd}$ data line, the 5$^{th}$ data line and the lines located between the 2$^{nd}$ data line and the 5$^{th}$ data line (e.g. the 3$^{rd}$ data line, and a portion of the second shorting bar SB2), the excess current of the testing signals is spread (or namely disperse) to the 2$^{nd}$ data line and the 5$^{th}$ data line. Accordingly, the leftest second connecting conductor C2 is not broken easily during testing processes. Additionally, since the leftest third connecting conductor (or namely the most outside third connecting conductor, or namely the outset third connecting conductor) C3 has sufficient area to extend across the 3$^{rd}$ data line, the 6$^{th}$ data line and the lines located between the 3$^{rd}$ data line and the 6$^{th}$ data line (e.g. a portion of the third shorting bar SB3), the excess current of the testing signals is spread (or namely disperse) to the 3$^{rd}$ data line and the 6$^{th}$ data line. Accordingly, the leftest third connecting conductor C3 is not broken easily during testing processes. The above-mentioned current spread may be explained as following. When a testing signal is transmitted to the first shorting bar SB1 as an example, a portion current of the testing signal is transmitted from the first shorting bar SB1 to the first data lines (e.g. the 1$^{st}$ data line DL1). Since the first connecting conductor C1 extends across other data lines (e.g. the 2$^{nd}$ data line DL2 and the 3$^{rd}$ data lines DL3) and is electrically connected to other first data lines (e.g. the 4$^{th}$ data line DL4). The portion current of the testing signal transmitted by the first data lines (e.g. the 1$^{st}$ data line DL1) is further transmitted to other first data lines (e.g. the 4$^{th}$ data line DL4) through the first connecting conductor C1. In other words, there are two current flows are transmitted by the first connecting conductor C1 and the first shorting bar SB1, respectively, and the two current flows as a parallel flows. The first connecting conductor C1 and the first shorting bar SB1 are parallel-connected. Additionally, the first data lines (the 1$^{st}$ data line DL1 and the 4$^{th}$ data line DL4) are also parallel-connected through the first shorting bar SB1. In the present embodiment, the parallel connection between the 1$^{st}$ data line DL1 and the 4$^{th}$ data line DL4 are enhanced by the first connecting conductor C1. Accordingly, an enhanced parallel-connected circuit is provided.

As shown in FIG. 4A, the data lines DL are electrically connected to one of the shorting bars SB through a plurality of first contact holes W1. Each of the first data lines (DL1, DL4, DL7, DL10, . . . , DL3n−2) are electrically connected to the first shorting bar SB1 through the first contact holes (or the first contact windows) W1 and the first connecting conductors C1. Each of the second data lines (DL2, DL5, DL8, DL11, . . . , DL3n−1) are electrically connected to the second shorting bar SB2 through the first contact holes W1 and the second connecting conductors C2. Additionally, each of the third data lines (DL3, DL6, DL9, DL12, . . . , DL3n) are electrically connected to the third shorting bar SB3 through the first contact holes (or namely first contact windows) W1 and the third connecting conductors C3. Specifically, the first contact holes W1 includes a plurality of contact holes W1' and a plurality of contact holes W1", wherein each of the first data lines (DL1, DL4, DL7, DL10, . . . , DL3$n$−2) are electrically connected to the first connecting conductors C1 through the contact holes (or namely the contact windows) W1'. Additionally, the first connecting conductors C1 are electrically connected to the first shorting bar SB1 through the contact holes W1". Each of the second data lines (DL2, DL5, DL8, DL11, . . . , DL3$n$−1) are electrically connected to the second connecting conductors C2 through the contact holes W1'. Additionally, the second connecting conductors C2 are electrically connected to the second shorting bar SB2 through the contact holes W1". Each of the third data lines (DL3, DL6, DL9, DL12, . . . , DL3$n$) are electrically connected to the third connecting conductors C3 through the contact holes W1". Additionally, the third connecting conductors C3 are electrically connected to the third shorting bar SB3 through the contact holes W1".

In the present embodiment, preferred, each of the shorting bars SB has at least one opening A to expose an end of one of the data lines DL, and a plurality of second contact holes (or the second contact windows) W2 are located in the opening A of the shorting bars SB. The opening A of the shorting bar SB allows the data lines DL and the connecting conductor C electrical connecting to each other through the plurality of second contact holes W2. In this way the electrical connection between the data lines DL and the connecting conductor C is more reliable. In other words, each of the first data lines (DL1, DL4, DL7, DL10, . . . , DL3$n$−2) are electrically connected to the first connecting conductors C1 through the second contact holes W2. Each of the second data lines (DL2, DL5, DL8, DL11, . . . , DL3$n$−1) are electrically connected to the second connecting conductors C2 through the second contact holes W2. Additionally, each of the third data lines (DL3, DL6, DL9, DL12, . . . , DL3$n$) are electrically connected to the third connecting conductors C3 through the second contact holes W2. In another embodiment, each of the shorting bars SB has no opening A formed therein. In an alternate embodiment, at least one shorting bar SB has no opening A formed therein.

Second Embodiment

Figure 5A:
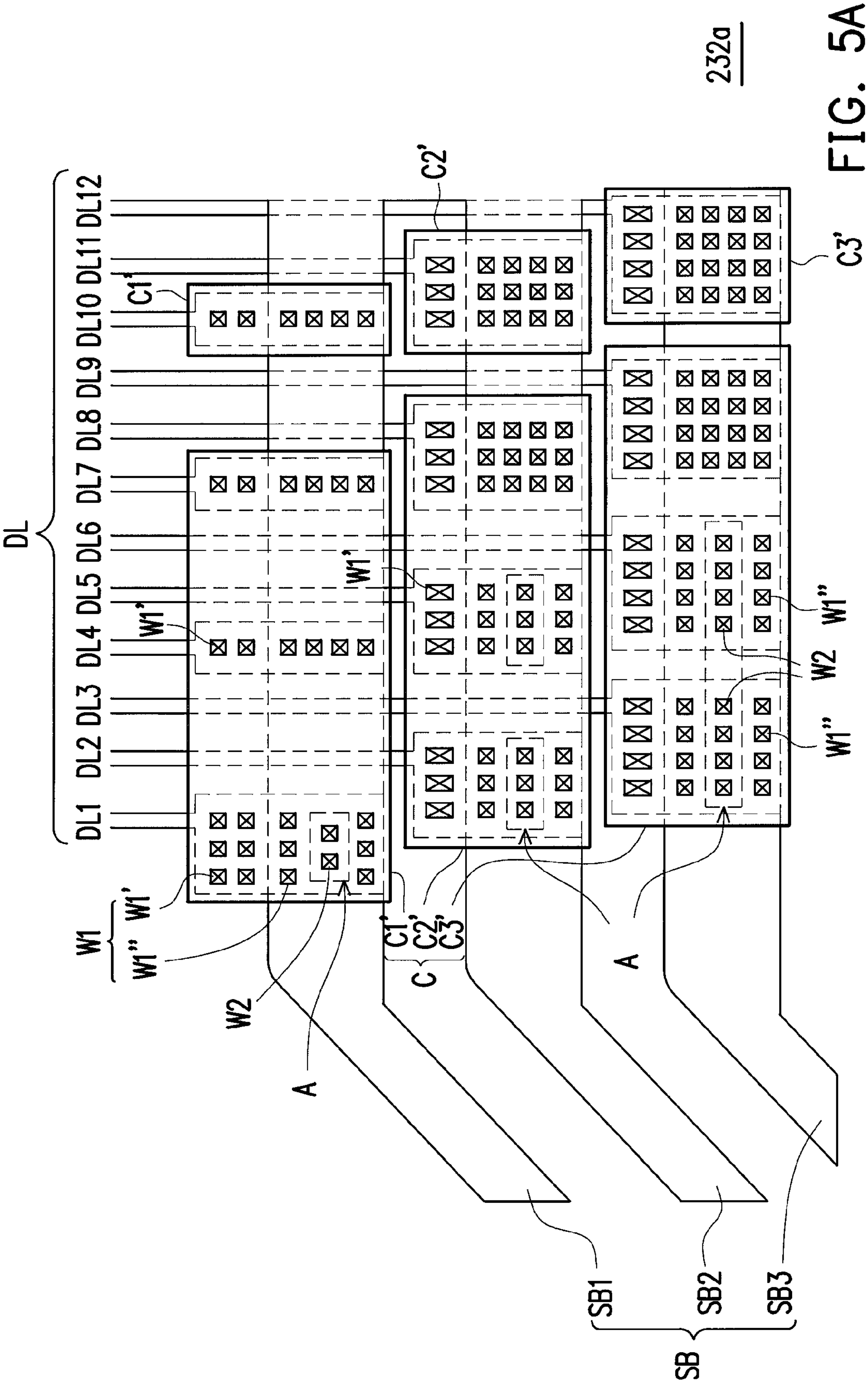
FIG. 5A is a top view of a testing circuit in accordance with the second embodiment of the present invention.
Figure 5B:
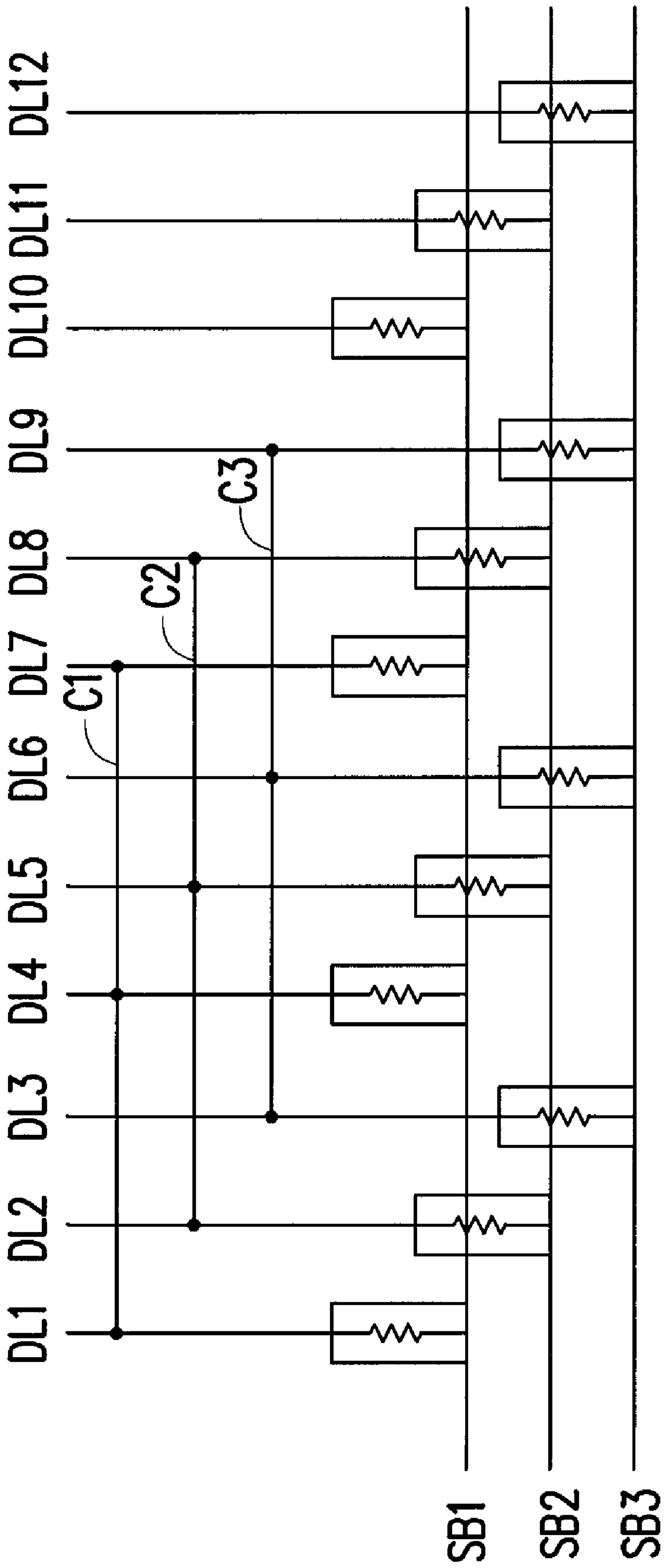
FIG. 5B is an equivalent circuitry of the prior art testing circuit shown in FIG. 5A.

FIG. 5A is a top view of a testing circuit in accordance with the second embodiment of the present invention. FIG. 5B is an equivalent circuitry of the testing circuit shown in FIG. 5A. Referring to FIG. 4A, FIG. 5A and FIG. 5B, the testing circuit 232$a$ of the present embodiment is similar with the testing circuit 232 of the first embodiment except that the 1$^{st}$ data line DL1, the 4$^{th}$ data line DL4, and the 7$^{th}$ data line DL7 in the testing circuit 232$a$ are electrically connected to each other through the leftest first connecting conductor C1'; the 2$^{nd}$ data line DL2, the 5$^{th}$ data line DL5, and the 8$^{th}$ data line DL8 in the testing circuit 232$a$ are electrically connected to each other through the leftest second connecting conductor C2'; and the 3$^{rd}$ data line DL3, the 6$^{th}$ data line DL6, and the 9$^{th}$ data line DL9 in the testing circuit 232$a$ are electrically connected to each other through the leftest third connecting conductor C3'.

As compared with the first embodiment, the leftest first connecting conductor C1' has sufficient area to extend across the 1$^{st}$ data line, the 7$^{th}$ data line and the lines located between the 1$^{st}$ data line and the 7$^{th}$ data line (e.g. the 2$^{nd}$ data line, the 3$^{rd}$ data line, the 5$^{th}$ data line, the 6$^{th}$ data line, and a portion of the first shorting bar SB1); the leftest second connecting conductor C2' has sufficient area to extend across the 2$^{nd}$ data line, the 8$^{th}$ data line and the lines located between the 2$^{nd}$ data line and the 8$^{th}$ data line (e.g. the 3$^{rd}$ data line, the 6$^{th}$ data line, and a portion of the second shorting bar SB2); and the leftest third connecting conductor C3' has sufficient area to extend across the 3$^{rd}$ data line, the 9$^{th}$ data line and the lines located between the 3$^{rd}$ data line and the 9$^{th}$ data line (e.g. a portion of the third shorting bar SB3). Accordingly, the testing circuit 232$a$ has better current spreading performance as compared with the first embodiment.

Third Embodiment

Figure 6A:
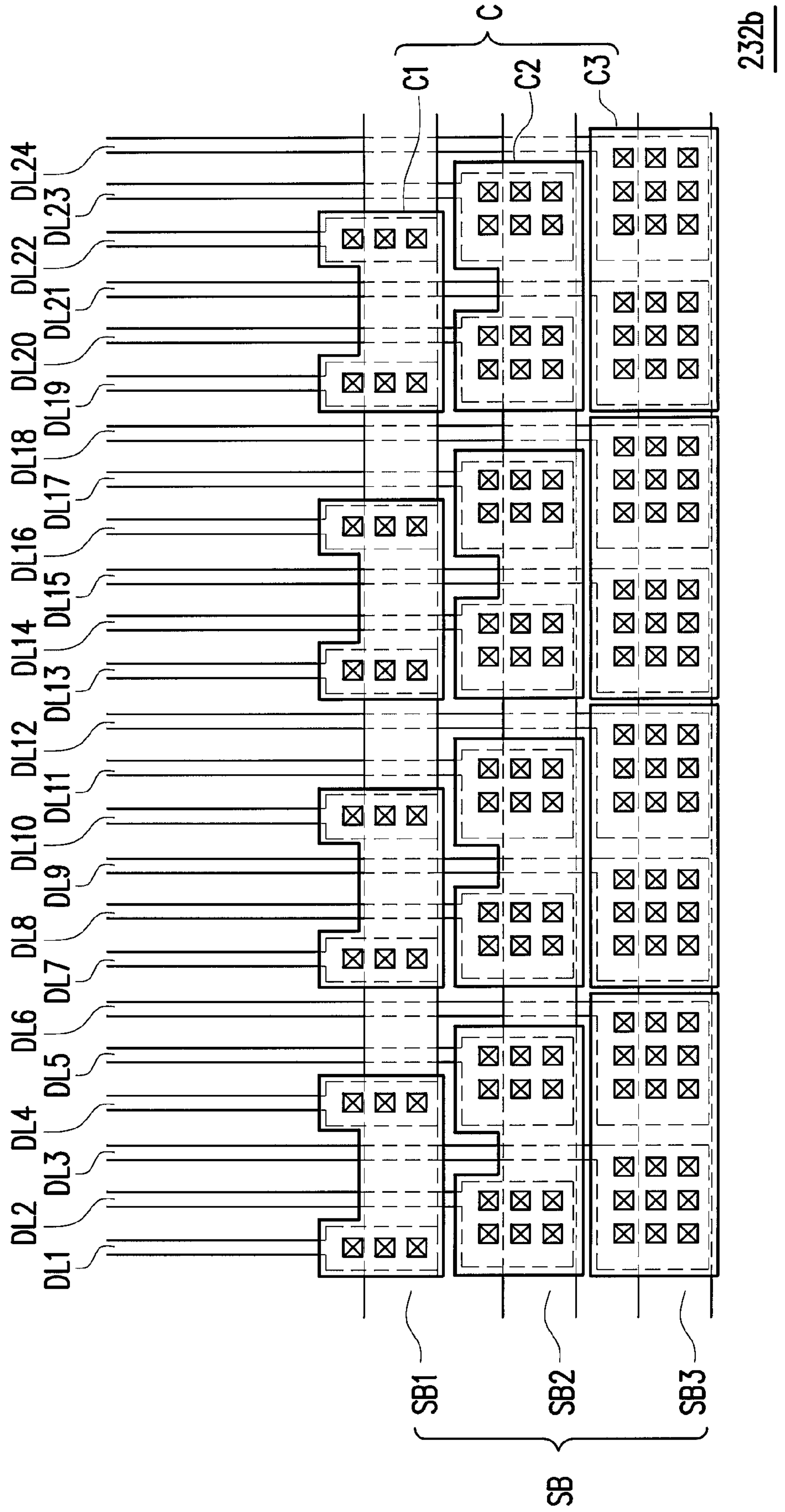
FIG. 6A is a top view of a testing circuit in accordance with the third embodiment of the present invention.
Figure 6B:
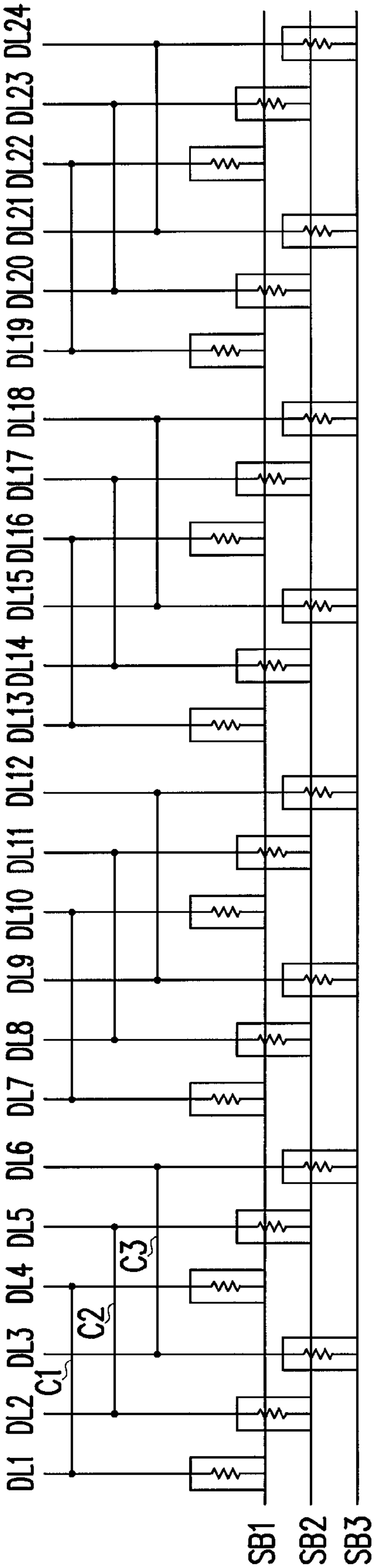
FIG. 6B is an equivalent circuitry of the prior art testing circuit shown in FIG. 6A.

FIG. 6A is a top view of a testing circuit in accordance with the third embodiment of the present invention. FIG. 6B is an equivalent circuitry of the testing circuit shown in FIG. 6A. Referring to FIG. 6A and FIG. 6B, in the testing circuit 232$b$ of the present embodiment, the quantity of the connecting conductors C extending across two of the data lines DL are greater than those in the first and second embodiments. In the present embodiment, each of the first connecting conductors C1, the second connecting conductors C2, and the third connecting conductors C3 extends across two of the data lines DL and electrically connected to the two data lines DL.

As shown in the present embodiment, the quantity of the first connecting conductors C1, the second connecting conductors C2 and the third connecting conductors C3 extending across two or more data lines DL can be properly modified, so as to optimize the current spreading performance of the testing circuit 232$b$.

Furthermore, in an alternate embodiment, the first connecting conductors C1 is electrically connected to all the first data lines (DL1, DL4, DL7, DL10, . . . , DL3$n$−2), the second connecting conductors C2 is electrically connected to all the second data lines (DL2, DL5, DL8, DL11, . . . , DL3$n$−1), and the third connecting conductors C3 is electrically connected to all the third data lines (DL3, DL6, DL9, DL12, . . . , DL3$n$). The shape of the opening A, the first contact holes W1, and the second contact holes W2 described in the above-mentioned embodiments is not limited to rectangle. The shape of the opening A, the first contact holes W1, and the second contact holes W2 can be modified according to actual requirements. In an alternate embodiment, the shape of the opening A, the first contact holes W1, and the second contact holes W2 are different. The shape of the opening A, the first contact holes W1, and the second contact holes W2 may be shaped as a circle, an ellipse, a triangle, a rhombus, a star, a pentagon, a hexagon, or other suitable polygons. In the above-mentioned embodiments, preferred, the material of the connecting conductors (C1, C2, C3) may be transparent conductive materials, such as indium tin oxide (ITO), indium zinc oxide (IZO), aluminum tin oxide (ATO), aluminum zinc oxide (AZO), cadmium tin oxide (CTO), or the combination thereof. Additionally, the material of the connecting conductors (C1, C2, C3) may also be reflective conductive materials, such as Au, Ag, Al, Sn, Ti, Mo, Ta, Cr, or the alloy thereof. The data lines located at most right side or most left side (e.g. DL1, DL2, DL3, DL3$n$−2, DL3$n$−1, DL3$n$) are electrically connected to the connecting conductors C and the shorting bars SB through a lot of contact holes (W1, W2). The quantity of the contact holes (W1, W2) connected to the data lines (DL1, DL2, DL3, DL3$n$−2, DL3$n$−1, DL3$n$) is greater than or equal to the quantity of the contact holes (W1, W2) connected to the data lines other than the data lines (DL1, DL2, DL3, DL3$n$−2, DL3$n$−1, DL3$n$). In an alternate embodiment, the quantity of the contact holes (W1, W2) connected to the data lines DL may increases or decreases gradually from right side or left side to the center. Additionally, in the above-described embodiments, the quantity of the contact holes connected to the outermost shorting bar (e.g. the third shorting bar SB3) is greater than that connected to the other shorting bars (e.g. the first shorting bar SB1 and the second shorting bar SB2). In other alternate embodiments, the quantity of the contact holes connected to the other shorting bars (e.g. the first shorting bar SB1 and the second shorting bar SB2) may be equal to that connected to the outermost shorting bar (e.g. the third shorting bar SB3).

Since the present invention utilizes at least one connecting conductor extending across two or more data lines to spread the current of the testing signals, the probability of the open circuit between the signal lines and the shorting bars is effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:

a substrate having a display region and a peripheral circuit region;

a pixel array disposed on the display region of the substrate, wherein the pixel array includes a plurality of signal lines and a plurality of pixels, each of the pixels is electrically connected to the signal lines respectively and extends from the display region to the peripheral region a peripheral circuit disposed on the peripheral region and comprises a testing circuit electrically connected to the signal lines, the testing circuit comprises:

a plurality of shorting bars; and a plurality of connecting conductors, wherein each of the signal lines is electrically connected to one of the shorting bars through one of the connecting connectors respectively, and at least two of the signal lines connected to the same shorting bar are electrically connected to each other through one of the connecting conductors.

2. The active device array substrate of claim 1, wherein the signal lines comprise:

a plurality of scan lines extend from the display region to the peripheral region; and a plurality of data lines extend from the display region to the peripheral region, wherein the data lines are electrically connected to the testing circuit.

3. The active device array substrate of claim 2, wherein the shorting bars comprises a first shorting bar, a second shorting bar, and a third shorting bar, the data lines comprises a plurality of first data lines electrically connected to the first shorting bar, a plurality of second data lines electrically connected to the second shorting bar, and a plurality of third data lines electrically connected to the third shorting bar.

4. The active device array substrate of claim 3, wherein the first data lines includes a plurality of $(3n-2)^{th}$ data lines, the second data lines includes a plurality of $(3n-1)^{th}$ data lines, and the third data lines includes a plurality of $(3n)^{th}$ data lines, n is any integer.

5. The active device array substrate of claim 4, wherein the connecting conductors comprise:

a plurality of first connecting conductors electrically connected to the first data lines and the first shorting bar;

a plurality of second connecting conductors electrically connected to the second data lines and the second shorting bar; and a plurality of third connecting conductors electrically connected to the third data lines and the third shorting bar.

6. The active device array substrate of claim 5, wherein the $1^{st}$ data line and the $4^{th}$ data line are electrically connected to each other through one of the first connecting conductors.

7. The active device array substrate of claim 5, wherein the $1^{st}$ data line, the $4^{th}$ data line, and the $7^{th}$ data line are electrically connected to each other through one of the first connecting conductors.

8. The active device array substrate of claim 5, wherein the $2^{nd}$ data line and the $5^{th}$ data line are electrically connected to each other through one of the second connecting conductors.

9. The active device array substrate of claim 5, wherein the $2^{nd}$ data line, the $5^{th}$ data line, and the $8^{th}$ data line are electrically connected to each other through one of the first connecting conductors.

10. The active device array substrate of claim 5, wherein the $3^{rd}$ data line and the $6^{th}$ data line are electrically connected to each other through one of the third connecting conductors.

11. The active device array substrate of claim 5, wherein the $3^{rd}$ data line, the $6^{th}$ data line, and the $9^{th}$ data line are electrically connected to each other through one of the third connecting conductors.

12. The active device array substrate of claim 1, wherein each of the signal lines is electrically connected to one of shorting bars through a plurality of first contact holes and one of the connecting conductors respectively.

13. The active device array substrate of claim 1, wherein each of the signal lines is electrically connected to one of connecting conductors through a plurality of second contact holes respectively.

14. The active device array substrate of claim 13, wherein each of the shorting bars has at least one opening to expose an end of one of the signal lines, and a portion of the second contact holes are located in the opening of the shorting bars.

* * * * *